US006303997B1

United States Patent
Lee (12) United States Patent
(10) Patent No.: US 6,303,997 B1
(45) Date of Patent: Oct. 16, 2001

(54) THIN, STACKABLE SEMICONDUCTOR PACKAGES

(75) Inventor: Seon Goo Lee, Seoul (KR)

(73) Assignees: Anam Semiconductor, Inc., Seoul (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/287,711

(22) Filed: Apr. 7, 1999

(30) Foreign Application Priority Data

Apr. 8, 1998 (KR) .................................................. 98-12364

(51) Int. Cl.[7] .................................................. H01L 23/48
(52) U.S. Cl. ........................ 257/778; 257/738; 257/686; 257/777; 257/787
(58) Field of Search .................................... 257/685, 686, 257/688, 668, 706, 707, 712, 737, 738, 777, 780, 778

(56) References Cited

U.S. PATENT DOCUMENTS

| | | | |
|---|---|---|---|
| 5,677,566 | * | 10/1997 | King et al. ............................ 257/666 |
| 5,895,965 | * | 4/1999 | Tanaka et al. ........................ 257/668 |
| 5,945,741 | * | 8/1999 | Ohsawa et al. ....................... 257/777 |
| 5,952,611 | * | 9/1999 | Eng et al. ............................ 257/691 |
| 6,049,129 | * | 4/2000 | Yew et al. ............................ 257/737 |
| 6,078,097 | * | 6/2000 | Ohsawa ................................ 257/666 |

* cited by examiner

Primary Examiner—Eddie Lee
Assistant Examiner—Lourdes Cruz (57) ABSTRACT

A thin, stackable semiconductor package having improved electrical and heat dissipating performance comprises a semiconductor chip having an integrated circuit and a plurality of input/output pads on a surface thereof. A lead frame having a plurality of inner leads with upper and a lower surfaces has one of those surfaces bonded to a surface of the chip with a bonding agent. The leads each has a projection formed on at least one of the upper and lower surfaces at a distal end portion of the lead. Each of the leads is electrically connected to an associated input/output pad of the chip through a wire bonding process using electrically conductive wires, or by a ball bonding process using electrically conductive balls. Alternatively, the leads may be directly bonded to the input/output pads of the chip by a TAB bonding process. An encapsulated portion envelops the semiconductor chip and the leads while exposing the projections of the leads to the atmosphere outside the encapsulated portion. A solder ball is welded to the bottom surface of the projection of each lead and is used as a signal input/output terminal of the package. A chip heat sink may be bonded to the chip to further increase the capacity of the package to dissipate heat away from the chip during operation.

35 Claims, 8 Drawing Sheets

PRIOR ART

THIN, STACKABLE SEMICONDUCTOR PACKAGES

BACKGROUND OF THE INVENTION

1. Field of the Invention

The present invention relates, in general, to semiconductor packages, and more particularly, to a semiconductor package that is responsive to the recent trend toward packages that are "super thin," that have both improved electrical and heat dissipating performance, and that allow mounting of a plurality of stacked packages on a mother board to maximize the component density of the mother board.

2. Description of the Related Art

As is well appreciated by those skilled in the art, it is necessary to package memory devices or other semiconductor devices to enable them to be mounted on a mother board with a high package density. That is, in order to accomplish, e.g., a desired large memory capacity on a limited area of a mother board, the semiconductor packages must not only incorporate improved semiconductor chip integration techniques, but must also be designed to be mounted in relatively large numbers in a limited area on the mother board.

In an effort to increase the package density of a mother board, it has previously been proposed to mount a plurality of ball grid array ("BGA") semiconductor packages on the mother board by stacking them, one on top of the other. In such an arrangement, the stacked packages form a single, interconnected, laminated package unit.

Figure 1:
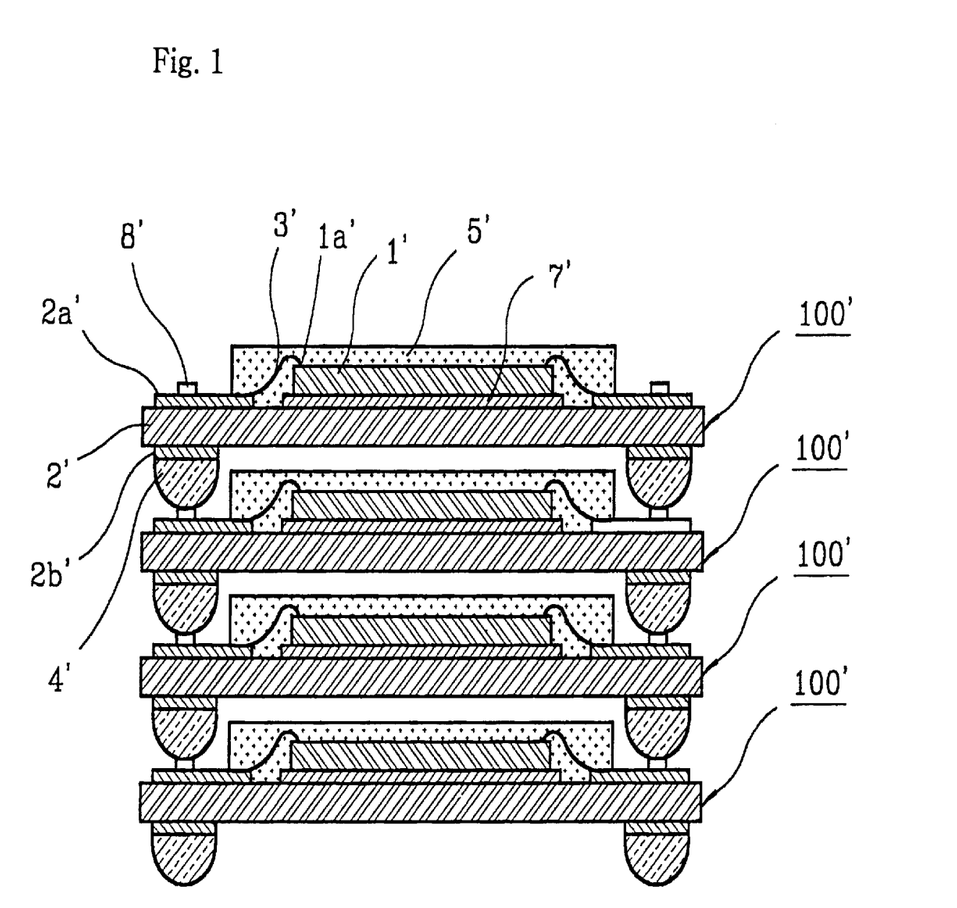
FIG. 1 is a sectional view of a laminated package unit formed by stacking a plurality of conventional semiconductor packages on top of one another.

FIG. 1 shows such a stacked, laminated semiconductor package unit according to the prior art. As shown in the drawing, the laminated semiconductor package unit comprises a plurality of individual packages 100' stacked on top of each other.

Each of the above prior art packages 100' comprises a semiconductor chip 1' bonded to the top surface of a printed circuit board ("PCB") 2' using a bonding agent 7'. The input/output pads 1a' of the chip 1' are electrically connected to a conductive circuit pattern 2a' formed on the top surface of the PCB 2' by a wire bonding process using a plurality of conductive wires 3'. The circuit pattern 2a' is also electrically connected to a plurality of solder ball lands 2b' formed on the lower surface of the PCB 2'. The pattern 2a' is electrically connected to the solder ball lands 2b' by a plurality of conductive via holes (not shown). A solder ball 4' is welded to each of the solder ball lands 2b'. The top portion of the PCB 2' is encapsulated using a packaging material, such as an epoxy resin, thereby forming an encapsulated portion 5' that protects the chip 1' and the conductive wires 3' from the atmosphere.

In the above package 100', a portion of the circuit pattern 2a' of the PCB 2' is exposed directly to the atmosphere, and a plurality of projection pads 8' are formed on the exposed portion in such a way such that the pads 8' project upwardly.

The packages 100' having the above-described construction may be individually mounted at distinct positions on a mother board. Alternatively, the packages 100' may be mounted on a mother board in a laminated, interconnected package unit wherein the individual packages 100' are stacked one on top of each other, as shown in FIG. 1. Such a laminated package unit desirably increases the package density of the mother board.

In order to assemble and interconnect such a stacked, laminated package unit, the solder balls 4' that are formed on the lower surface of each upper package 100' are welded to the projection pads 8' that are formed on the top surface of each lower package 100'.

However, the prior art laminated package unit is somewhat problematic in that the overall height of the unit typically exceeds a desirable maximum height, which is due to the cumulative thickness of each of the individual packages 100'. That is, since the laminated package unit is formed by welding the solder balls 4' of each upper package 100' to the projection pads 8' of each lower package 100' as described above, the assembled unit resultingly has an excessive height, even though the unit may desirably increase the package density of a mother board. This excessive height of the laminated package unit effectively prevents an electronic device incorporating such a package from achieving a profile that is small, thin, and compact.

It may be noted that such a laminated package unit also necessarily increases the density of the heat emitted by the chips of the packages, but is lacking in any means for effectively dissipating that heat away from the chips and into the atmosphere. Therefore, packages incorporating the above prior art design typically exhibit significantly reduced processing speeds and mean-times-between-failure ("MTBFs").

In addition, a conventional PCB for a semiconductor package typically has a relatively long circuit pattern on its top surface, thus lengthening the signal path and thereby adversely affecting the electrical performance of the package. Also, the individual packages of the typical stacked, laminated package unit typically incorporate a relatively expensive PCB, thereby increasing the production cost of the laminated package units.

SUMMARY OF THE INVENTION

The present invention has been made with the above problems of the prior art in mind, and accordingly, an object of the present invention is to provide a much thinner semiconductor package that is formed by using a lead frame having a plurality of projections on at least one of the upper and lower surfaces thereof, a package that also has both improved electrical and heat dissipating performance, and one that enables a plurality of such packages to be mounted on a mother board in a stacked, interconnected arrangement, thereby maximizing the package density of the mother board.

The above and other objects and advantages are achieved in a semiconductor package that, according to one embodiment of this invention, comprises a semiconductor chip having an integrated circuit. A plurality of input/output pads are disposed on a central portion of a first surface of the semiconductor chip for making electrical connections between the integrated circuit and an external circuit. A plurality of leads communicate with the exterior of the package. Each lead has an upper and a lower surface, one of which is bonded to the first surface of the semiconductor chip, and a projection having a raised surface formed on at least one of the upper and lower surfaces of the lead at a distal end thereof. The package also includes connection means for electrically connecting each lead of the plurality of leads to a corresponding input/output pad of the chip. An encapsulated portion envelops the semiconductor chip, plurality of leads and the connection means such that the raised surfaces of the projections are flush with an outer surface of the encapsulated portion. A plurality of solder balls are respectively welded to the raised surface of the projection of each lead of the plurality of leads to comprise signal input/output terminals of the package.

In the above embodiment, a second surface of the semiconductor chip opposite to the surface having the input/output pads on it is exposed to the atmosphere outside of the encapsulated portion, thus providing a means for effectively dissipating heat away from the chip during operation.

Another embodiment of this invention provides a semiconductor package, comprising a semiconductor chip having an integrated circuit with a plurality of input/output pads on a peripheral portion of a first surface of the chip for making electrical connections between the integrated circuit of the chip and an external circuit. A chip heat sink having a foot print that is smaller than the foot print of the chip is bonded to the first surface of the chip. A plurality of leads, each having an upper and a lower surface, one of which is bonded to the first surface of the semiconductor chip, communicates with the exterior of the semiconductor package. Each of the leads has a projection having a raised surface formed on at least one of the upper and lower surfaces of the lead at a distal end thereof. Connection means are provided for electrically connecting each lead of the plurality of leads to a corresponding input/output pad of the chip. An encapsulated portion envelops the semiconductor chip, the plurality of leads and the connection means such that the raised surfaces of the projections are flush with an outer surface of the encapsulated portion. A plurality of solder balls are respectively welded to the raised surface of the projection of each lead of the plurality of leads to comprise signal input/output terminals of the package.

In the second embodiment above, the chip heat sink may be bonded to either the first surface of the chip, i.e., the one having the input/output pads on it, or a second surface of the chip that is opposite to the first surface. In either case, the chip heat sink itself may also have a surface that is exposed to the atmosphere out-side of the encapsulated portion, thereby providing a means for effectively dissipating heat from the chip during operation thereof.

The connection means, used for electrically connecting each of the leads to an associated input/output pad of the semiconductor chip, may be formed by a wire bonding process using conductive wires, or by a ball bonding process using conductive balls, Alternatively, the connection means may be formed by thermally bonding the leads directly to the input/output pads of the chip through a thermal attachment bonding ("TAB") process.

In addition, the projections may be formed exclusively on the lower surface of the leads, with the bottom surfaces of the projections being exposed to the atmosphere outside of the encapsulated portion. In such a configuration, the upper surface of the leads is also exposed to the atmosphere outside the encapsulated portion, thereby enabling a plurality of packages of this invention to be stacked on top of each other and interconnected to form a single, laminated package unit.

The projections may also be formed at the extreme, or outermost, distal end of the leads, with the extreme, or outermost, end of each projection being exposed to the atmosphere outside of the encapsulated portion to further enhance the heat dissipating capabilities of the package.

BRIEF DESCRIPTION OF THE DRAWINGS

The above and other objects, features and advantages of the present invention will be more clearly understood from the following detailed description, taken in conjunction with the accompanying drawings, in which:

FIG. 7 is a sectional view of a semiconductor package in accordance with the fifth embodiment of the present invention, with upper and lower projections being formed at the outermost ends of a lead frame; and, FIGS. 8 to 14 are sectional views of semiconductor packages in accordance with sixth to twelfth embodiments of the present invention, respectively, with a chip heat sink exposed to the atmosphere being provided at one side of each package, in which:

DETAILED DESCRIPTION OF THE INVENTION

This application is substantially similar to Korean Patent Application No. 98-12364, filed Apr. 8, 1998, the disclosure of which is incorporated herein in its entirety by this reference.

Figure 2A:
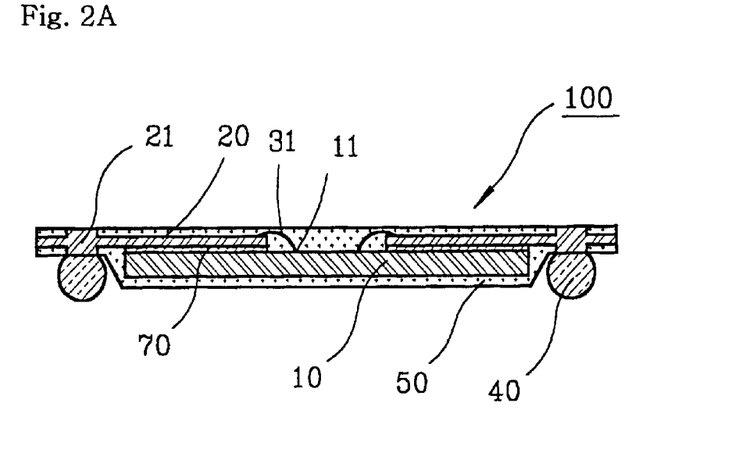
FIGS. 2a and 2b are sectional and plan views of a semiconductor package in accordance with a first embodiment of the present invention.
Figure 2B:
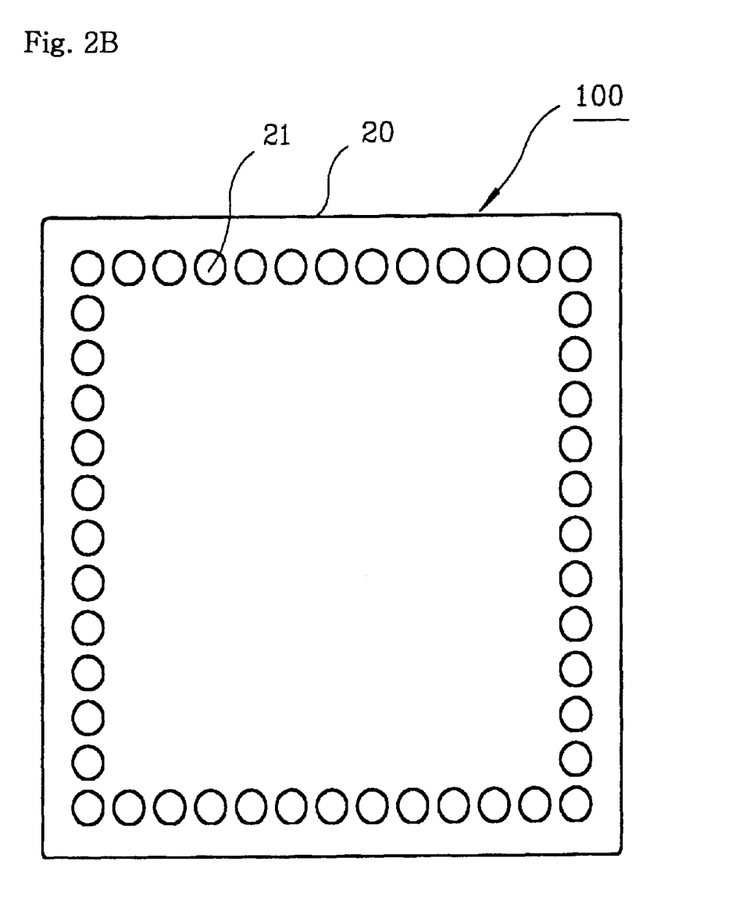

FIGS. 2a and 2b are sectional and bottom plan views, respectively, of a semiconductor package in accordance with the first embodiment of the present invention. As shown in the drawings, the semiconductor package 100 comprises a semiconductor chip 10 having an integrated electronic circuit. A plurality of input/output pads 11 are provided on the central portion of the top surface of the chip 10 for leading a signal from the electronic circuit to the outside of the package 100, while the inner leads 20 of a lead frame are bonded to a surface of the chip 10 using a bonding agent 70.

The inner leads 20 of the lead frame extend radially inward toward the input/output pads 11 of the chip 10, and upper and lower projections 21 are formed on the respective upper and lower surfaces of each lead 20 at the outer, or distal, end portion of each lead 20.

In the present invention, it is preferable to form the upper and lower projections 21 by means of an etching process during the manufacture of the lead frame, starting with a copper plate. That is, the copper plate is etched at portions corresponding to the inner and outer leads, while other portions corresponding to the projections 21 are not etched.

The bonding agent 70 used for bonding the inner leads 20 to the top surface of the chip 10 is selected from non-conductive materials, such as known epoxy resins or double-faced tapes.

In the first embodiment, the input/output pads 11 of the chip 10 are electrically connected to the inside ends of the inner leads 20 using conductive wires 31, such as gold wires or aluminum wires.

A solder ball 40, used as an input/output terminal of the package 100, is welded to the bottom surface of the lower projection 21 of each inner lead 20. The semiconductor chip 10, the leads 20 and the conductive wires 31 are encapsulated with a known molding material, such as epoxy molding compound, or "glob top," thereby forming an encapsulated portion 50 capable of protecting the chip 10, the leads 20 and the conductive wires 31 from the atmosphere. In this case, the top surS face of each upper projection 21 is left exposed to the atmosphere.

Figure 3:
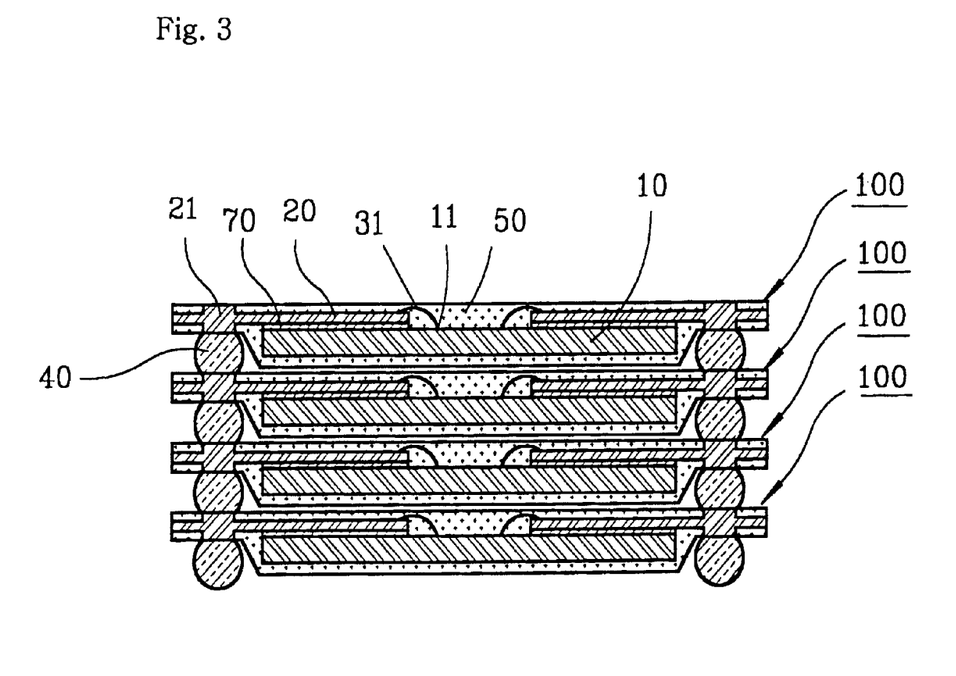
FIG. 3 is a sectional view of a laminated package unit formed by stacking a plurality of semiconductor packages of the type shown in FIGS. 2a and 2b on top on one another.

FIG. 3 is a sectional view of a laminated package unit formed by stacking a plurality of the semiconductor packages 100 of FIGS. 2a and 2b, one on top of the other.

The individual packages 100 of this invention may be separately mounted at distinct positions on a mother board, or alternatively, the packages 100 may be mounted on a mother board in a laminated package unit in which a number of interconnected packages 100 are stacked on top of each other, as shown in FIG. 3. Such a laminated package unit significantly increases the package density of the mother board.

In order to form and interconnect such a stacked, laminated package unit, the projections 21 of the leads 20 are used for electrically connecting the packages 100 to each other, since the projections 21 are left bare, or exposed to the atmosphere, at their top surfaces. Thus, two packages 100 are stacked, one on top of the other, with the solder balls 40 of the upper package 100 being positioned on the exposed top surfaces of the projections 21 of the lower package 100. The two stacked packages 100 are then subjected to a reflow process, thereby fixing and electrically interconnecting the laminated packages 100 to each other. After the primary reflow process, another package 100 is laid on top of the upper one of the two previously laminated packages 100 prior to being subjected to a second reflow process. The above-described package stacking and reflow process is repeated until a laminated package unit having the desired number of levels of electrically interconnected individual packages 100 is obtained.

FIGS. 4 to 14 are sectional views showing the construction of individual semiconductor packages in accordance with the second to twelfth embodiments of the present invention, respectively. In the second to twelfth embodiments, the general shape of the semiconductor packages remains the same as that described above for the first embodiment, but the electrical connecting means, used for connecting the leads to the input/output pads of the semiconductor chip, the configuration of the projections of the leads, and the parts, exposed to the atmosphere outside of the encapsulated portion, are altered as follows.

Figure 4:
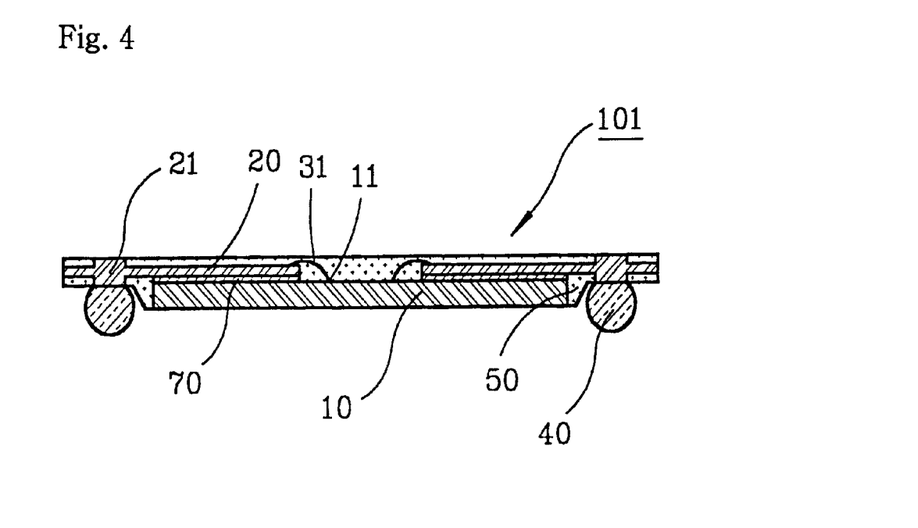
FIG. 4 is a sectional view of a semiconductor package in accordance with a second embodiment of the present invention, with the semiconductor chip of the package being exposed to the atmosphere.

FIG. 4 shows a semiconductor package 101 according to the second embodiment of this invention. In the second embodiment, the surface of the semiconductor chip 10 opposite to the surface having the input/output pads 11 on it is exposed to the atmosphere outside of the encapsulated portion 50 so that the package 101 has an improved heat dissipating performance.

Figure 5:
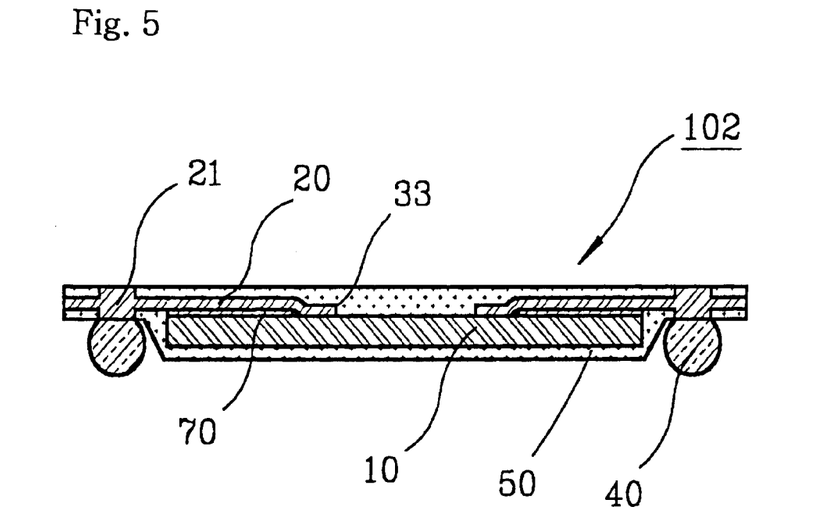
FIG. 5 is a sectional view of a semiconductor package in accordance with a third embodiment of the present invention, with the inner leads of a lead frame being directly bonded to a semiconductor chip through a TAB bonding process.

FIG. 5 shows a semiconductor package 102 according to the third embodiment. In the third embodiment, the inside ends of the inner leads 20 are laid on top of the input/output pads 11 of the semiconductor chip 10 prior to being thermally bonded directly to the pads 11, thus forming TAB bonds 33 at the junction between the pads 11 and the leads 20. The package 102 thus eliminates the need for any conductive wires 31 or conductive balls to effect electrical connection between the chip and the leads, thereby achieving a desirable reduction in manufacturing cost.

Figure 6:
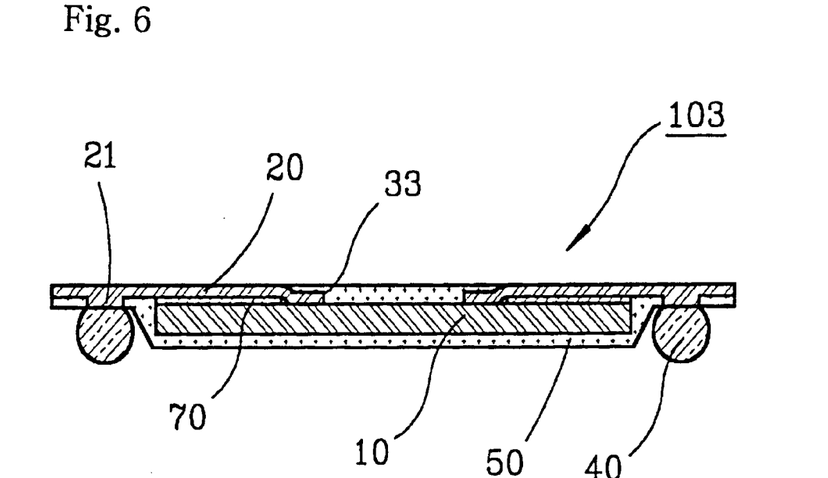
FIG. 6 is a sectional view of a semiconductor package in accordance with a fourth embodiment of the present invention, with the upper surface of a lead frame lacking any upper projections and exposed to the atmosphere.

FIG. 6 shows a semiconductor package 103 in accordance with the fourth embodiment of this invention. In the fourth embodiment, each inner lead 20 has a lower projection 21, while the upper surface of each lead 20 lacks any such upper projection 21 on it. In addition, both the upper surface of each lead 20 and the bottom surface of each lower projection 21 are exposed to the atmosphere outside of the encapsulated portion 50. This embodiment thus achieves a desirable reduction in the thickness of the semiconductor package.

Figure 7:
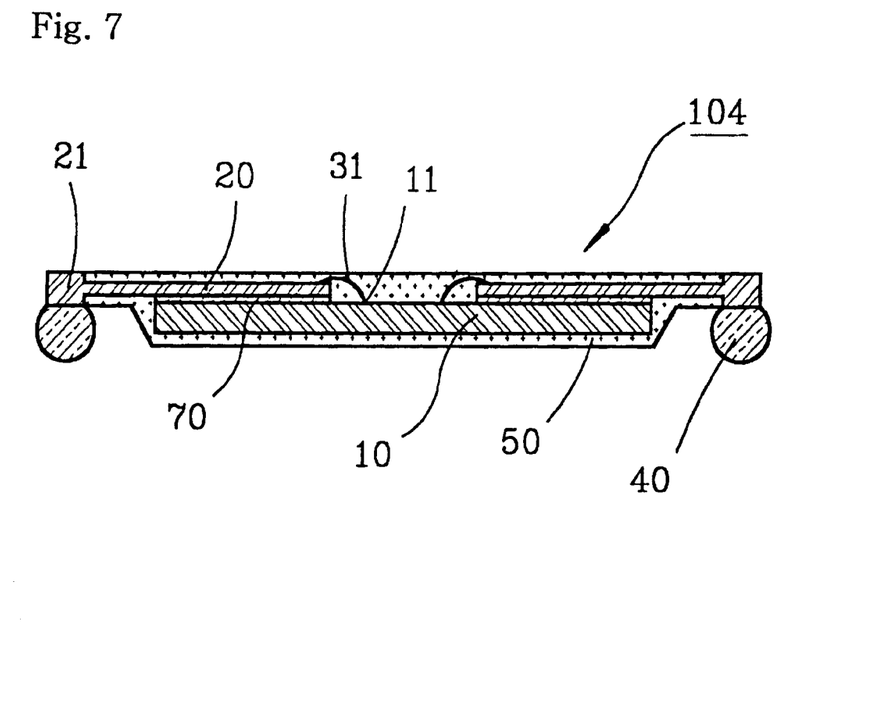

FIG. 7 shows a semiconductor package 103 according to the fifth embodiment of this invention. In the fifth embodiment, upper and lower projections 21 on each lead 20 are formed at the extreme, or outermost, ends of each lead 20. The outside ends of the projections 21 are exposed to the atmosphere outside the encapsulated portion 50. The package 103 of this embodiment thereby achieves an improved heat dissipating performance through the exposed ends of the leads.

FIGS. 8 to 14 show semiconductor packages in accordance with the sixth to twelfth embodiments of this invention, respectively. In each of the sixth to twelfth embodiments, the input/output pads 11 are arranged along the outside edge of the semiconductor chip 10. In addition, the semiconductor chip 10 is mounted to a chip heat sink 60 that has a surface opposite to the chip mounting surface that is exposed to the atmosphere outside of the encapsulated portion 50, thereby achieving enhanced heat dissipation from the chip 10 during operation.

Figure 8:
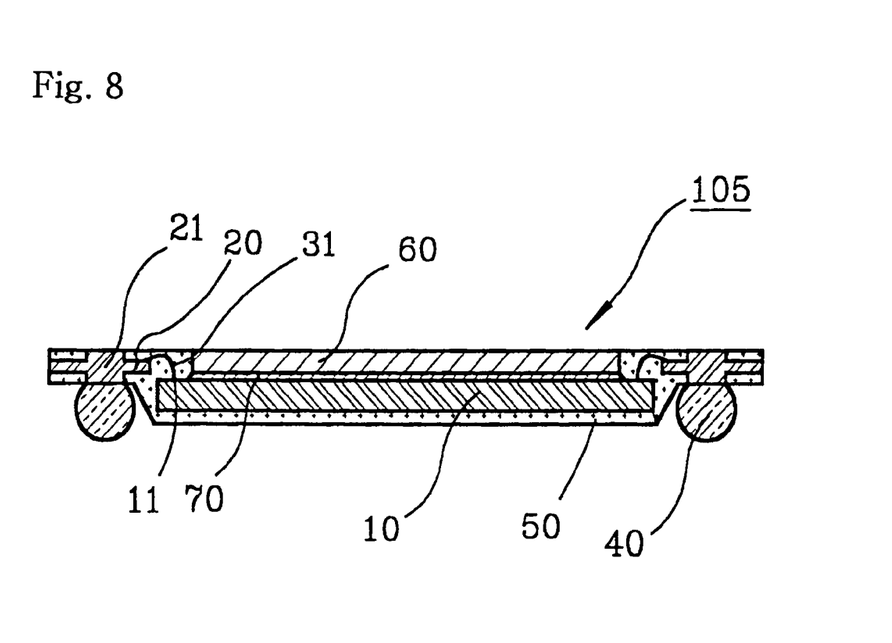
FIG. 8 shows a semiconductor package in accordance with the sixth embodiment, with the chip heat sink attached to a surface of semiconductor chip having input/output pads thereon.

In a semiconductor package 105 according to the sixth embodiment of FIG. 8, a chip heat sink 60 that is smaller than the chip 10 is bonded to the surface of the chip that has the input/output pads 11 on it by means of a bonding agent 70. The surface of the heat sink 60 opposite to the chip bonding surface is exposed to the atmosphere outside of the encapsulated portion 50. The package 105 of this embodiment quickly and effectively dissipates heat from the chip 10 through the exposed heat sink surface and into the atmosphere during operation of the chip.

The leads 20 are positioned along the outside edge of the chip 10 and are individually and electrically connected to an associated input/output pad 11 of the chip 10 by a wire bonding process using conductive wires 31.

Figure 9:
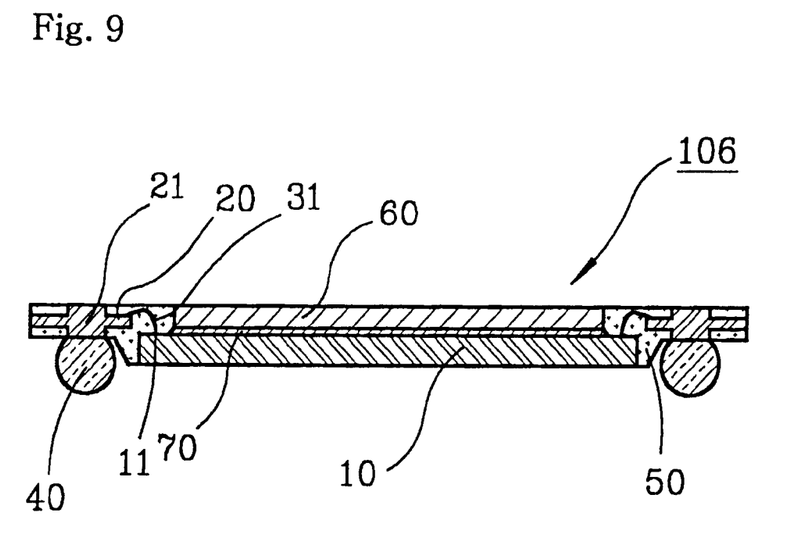
FIG. 9 shows a semiconductor package in accordance with the seventh embodiment, with a semiconductor chip exposed to the atmosphere.

In a semiconductor package 106 according to the seventh embodiment of FIG. 9, a chip heat sink 60 that is smaller than the chip 10 is bonded by means of a bonding agent 70 to the surface of the chip having the input/output pads 11 on it, and the surface of the heat sink opposite to the chip mounting surface is exposed to the atmosphere outside of the encapsulated portion 50, in the same manner as that described above for the sixth embodiment. However, unlike the Sixth embodiment, the surface of the chip 10 opposite to the surface having the input/output pads 11 on it is also exposed to the atmosphere through the encapsulation material, so that the package 106 even more quickly and effectively dissipates heat from the chip 10 through the two respective exposed surfaces and into the atmosphere during operation of the chip. That is, since both the semiconductor chip 10 and the chip heat sink 60 each has a surface that is exposed to the atmosphere outside of the encapsulated portion 50, the heat dissipating performance of the package 106 is even more improved.

In order to expose to the atmosphere the surface of the chip 10 opposite to the surface having the input/output pads 11 on it, it is preferable to form the encapsulated portion 50 by limiting the application of the packaging material to the portions around the edge of the semiconductor chip 10 only.

Figure 10:
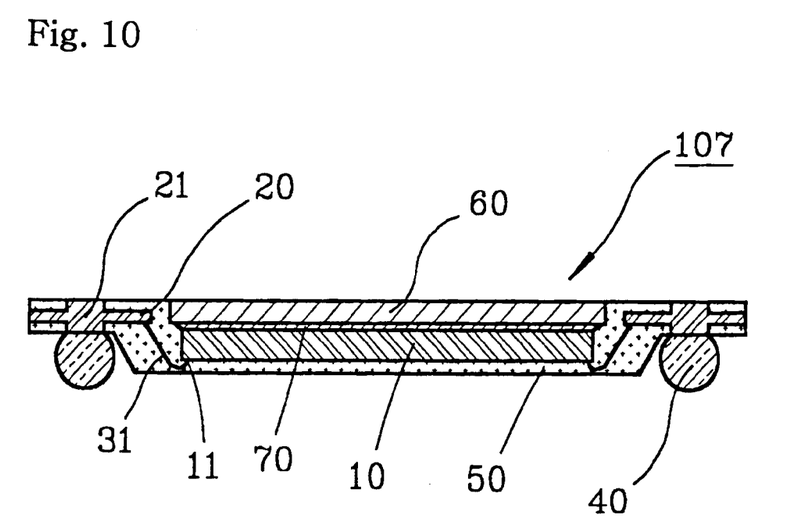
FIG. 10 shows a semiconductor package in accordance with the eighth embodiment, with the chip heat sink being attached to a semiconductor chip at a surface opposite to the surface having input/output pads on it.

In a semiconductor package 107 according to the eighth embodiment of FIG. 10, a chip heat sink 60 is bonded by means of a bonding agent 70 to the surface of the chip opposite to the surface having the input/output pads 11 on it. In this embodiment, the chip heat sink 60 may be larger than the chip 10. The package 107 quickly and effectively dissipates heat from the chip 10 into the atmosphere during operation.

Figure 11:
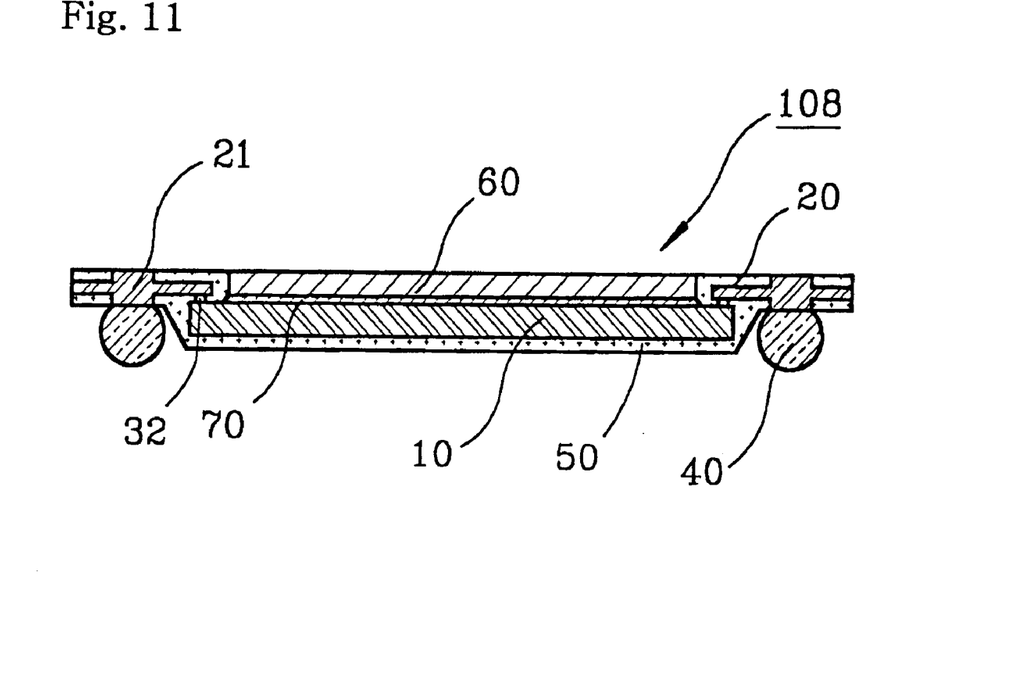
FIG. 11 shows a semiconductor package in accordance with the ninth embodiment, with the inner leads of a lead frame being bonded to a semiconductor chip using a plurality of conductive balls.

FIG. 11 shows a semiconductor package 108 in accordance with the ninth embodiment, in which the inner leads 20 are bonded to the input/output pads 11 of a semiconductor chip 10 by means of a plurality of conductive balls 32. By use of the conductive balls 32, it is possible to reduce the length of the electric signal path between the pads 11 and the leads 20 of the package 108.

Figure 12:
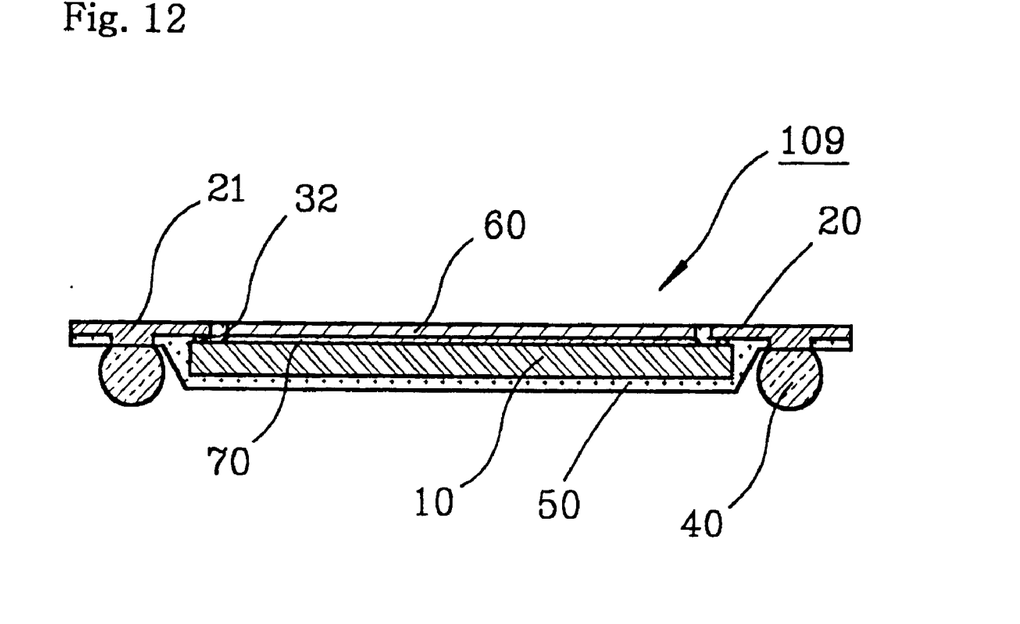
FIG. 12 shows a semiconductor package in accordance with the tenth embodiment of the present invention, with the upper surface of a lead frame lacking any upper projections and being exposed to the atmosphere.

In a semiconductor package 109 according to the tenth embodiment of FIG. 12, each lead 20 has a lower projection 21, while the upper surface of each lead 20 lacks any upper projection 21. In addition, both the upper surface of each lead 20 and the bottom surface of each lower projection 21 are exposed to the atmosphere outside the encapsulated portion 50. This embodiment thus achieves a desirable reduction in the thickness of the semiconductor package.

Figure 13:
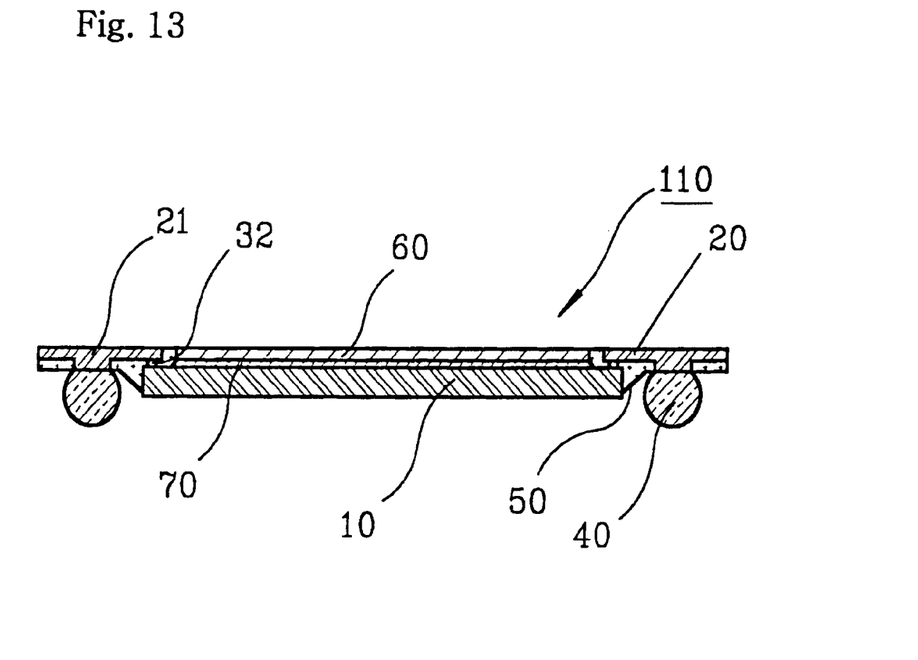
FIG. 13 shows a semiconductor package in accordance with the eleventh embodiment of the present invention, with both the upper surface of a lead frame lacking any upper projections and being exposed to the atmosphere, and a semiconductor chip being exposed to the atmosphere; and, FIG. 14 is a sectional view of a semiconductor package in accordance with the twelfth embodiment of the present invention, with upper and lower projections being formed at the outermost ends of a lead frame.

FIG. 13 shows a semiconductor package 110 in accordance with the eleventh embodiment of this invention. In this embodiment, each lead 20 has a lower projection 21, while the upper surface of each lead 20 is free of any upper projection 21, thus preferably reducing the thickness of the semiconductor package 110 in the same manner as that described for the tenth embodiment above. In addition, a surface of the chip 10 opposite to the surface having the input/output pads 11 on it is exposed to the atmosphere outside of the encapsulated portion 50, thereby enhancing the heat dissipating performance of the package 110.

Figure 14:
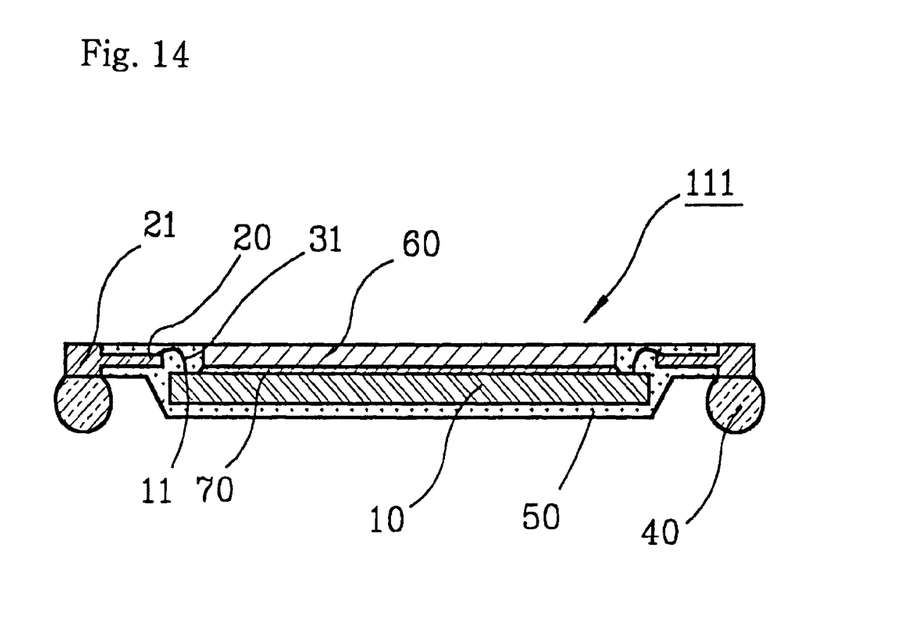

In a semiconductor package 111 according to the twelfth embodiment of FIG. 14, the upper and lower projections 21 of each lead 20 are formed at the outermost ends of the lead 20. The outermost ends of the projections 21 are exposed to the atmosphere outside of the encapsulated portion 50 to act as heat radiators. The package 103 of this embodiment thus more effectively dissipates heat from a semiconductor chip 10 into the atmosphere.

In the above-mentioned embodiments, in order to expose a surface of a semiconductor chip 10 opposite to the other surface having the input/output pads 11 to the atmosphere, it is preferable to form the encapsulated portion 50 by limiting the application of the packaging material, such as glob top material, to the portions around the edge of the semiconductor chip 10 only. Such encapsulation techniques and materials are well known to those skilled in the art.

As described above, the present invention provides a semiconductor package which uses both a lead frame and solder balls in place of a PCB. The package of this invention is thus substantially thinner and has better electrical and heat dissipating capabilities than prior art packages. In the package of this invention, either a chip heat sink or a semiconductor chip, or both, may have a broad surface exposed to the atmosphere outside the encapsulated portion to serve as an efficient heat radiator, thereby affording enhanced dissipation of heat into the ambient atmosphere. The heat dissipating performance of the package is thus much improved. In addition, the packages of this invention, e.g., memory devices, may be effectively mounted on a mother board in a laminated unit assembly, with individual packages stacked on top of each other. The semiconductor package of this invention is thus capable of substantially increasing the package density of the mother board.

Although the preferred embodiments of the present invention have been disclosed for illustrative purposes, those skilled in the art will appreciate that various modifications, additions and substitutions are possible, without departing from the scope and spirit of the invention as defined in the accompanying claims.

What is claimed is:

1. A semiconductor package, comprising:
    a semiconductor chip having an integrated circuit;
    a plurality of input/output pads on a central portion of a first surface of said semiconductor chip for making electrical connections between the integrated circuit of said semiconductor chip and a circuit external thereto;
    a plurality of leads from a lead frame, each said lead having an inner end portion extending radially inward toward said input/output pads on said chip and an upper and a lower surface, one of which surfaces is bonded to said first surface of said semiconductor chip, and a projection having a raised surface formed on each of said upper and lower surfaces of each said lead at a distal end portion thereof;
    connection means for electrically connecting said leads of said plurality of leads to corresponding input/output pads of said semiconductor chip;
    an encapsulated portion enveloping said semiconductor chip, said plurality of leads and said connection means such that said raised surfaces of said projections are flush with an outer surface of said encapsulated portion; and,
    a plurality of solder balls respectively welded to said raised surface of said projection of each said lead on at least one of said upper and lower surfaces thereof.

2. The semiconductor package according to claim 1, wherein said plurality of solder balls comprise input/output terminals of said semiconductor package.

3. The semiconductor package according to claim 1, wherein a second surface of said semiconductor chip opposite to said first surface thereof is exposed to the atmosphere exteriorly of said encapsulated portion for dissipation of heat therefrom.

4. The semiconductor package according to claim 1, wherein a second surface of said semiconductor chip opposite to said first surface thereof is exposed to the atmosphere exteriorly of said encapsulated portion for dissipation of heat therefrom.

5. The semiconductor package according to claim 1, wherein said connection means comprise electrically conductive wires.

6. The semiconductor package according to claim 1, wherein said connection means comprise electrically conductive balls.

7. The semiconductor package according to claim 1, wherein said connection means comprise a direct attachment of each said lead of said plurality of leads to a corresponding input/output pad of said semiconductor chip.

8. The semiconductor package according to claim 1, wherein said projection is formed at an extremity of each said lead for dissipation of heat therefrom.

9. A semiconductor package, comprising:
a semiconductor chip having an integrated circuit;
a plurality of input/output pads on a first surface of said semiconductor chip for making electrical connections between the integrated circuit of said semiconductor chip and a circuit external thereto;
a chip heat sink having a surface bonded to a surface of said semiconductor chip;
a plurality of leads from a lead frame, each said lead having an inner end portion extending radially inward toward said input/output pads on said chip and an upper and a lower surface, one of which surfaces is bonded to a surface of said semiconductor chip, and a projection having a raised surface integrally formed on each of said upper and lower surfaces of each said lead at a distal end portion thereof;
connection means for electrically connecting said leads of said plurality of leads to corresponding input/output pads of said semiconductor chip;
an encapsulated portion enveloping said semiconductor chip, said plurality of leads and said connection means such that said raised surfaces of said projections are flush with an outer surface of said encapsulated portion; and,
a plurality of solder balls respectively welded to said raised surface of said projection of each said lead on at least one of said upper and lower surfaces thereof.

10. The semiconductor package according to claim 9, wherein said plurality of solder balls comprise input/output terminals of said semiconductor package.

11. The semiconductor package according to claim 9, wherein a second surface of said semiconductor chip opposite to said first surface thereof is exposed to the atmosphere exteriorly of said encapsulated portion for dissipation of heat therefrom.

12. The semiconductor package according to claim 9, wherein said chip heat sink is bonded to said first surface of said semiconductor chip.

13. The semiconductor package according to claim 9, wherein said chip heat sink is bonded to a second surface of said semiconductor chip opposite to said first surface thereof.

14. The semiconductor package according to claim 9, wherein said chip heat sink has a surface opposite to said surface bonded to said semiconductor chip that is exposed to the atmosphere exteriorly of said encapsulated portion of said package for dissipation of heat therefrom.

15. The semiconductor package according to claim 9, wherein said connection means comprise electrically conductive wires.

16. The semiconductor package according to claim 9, wherein said connection means comprise electrically conductive balls.

17. The semiconductor package according to claim 9, wherein said connection means comprise a direct attachment of each said lead of said plurality of leads to a corresponding input/output pad of said semiconductor chip.

18. The semiconductor package according to claim 9, wherein said projection is formed at an extremity of each said lead for dissipation of heat therefrom.

19. The semiconductor package according to claim 9, wherein said chip heat sink has a surface exposed to the atmosphere exteriorly of said encapsulated portion.

20. The semiconductor package according to claim 1, wherein said package comprises one of a plurality of said packages stacked on top of and electrically connected to one another.

21. The semiconductor package according to claim 9, wherein said package comprises one of a plurality of said packages stacked on top of and electrically connected to one another.

22. A semiconductor package, comprising:
a semiconductor chip having an integrated circuit;
a plurality of input/output pads on a central portion of a first surface of said semiconductor chip for making electrical connections between the integrated circuit of said semiconductor chip and a circuit external thereto;
a plurality of leads from a lead frame, each said lead having an inner end portion extending radially inward toward said input/output pads on said chip and an upper and a lower surface, one of which surfaces is bonded to said first surface of said semiconductor chip, and a projection having a raised surface formed on at least one of said upper and lower surfaces of each said lead at a distal end portion thereof;
connection means for electrically connecting said leads of said plurality of leads to corresponding input/output pads of said semiconductor chip;
an encapsulated portion enveloping said semiconductor chip, said plurality of leads and said connection means such that said raised surfaces of said projections are flush with al outer surface of aid encapsulated portion, and a second surface of said semiconductor chip opposite to said first surface thereof is exposed to the atmosphere exteriorly of said encapsulated portion; and,
a plurality of solder balls respectively welded to said raised surface of said projection of each said lead on at least one of said upper and lower surfaces thereof.

23. The semiconductor package according to claim 22, wherein said connection means comprise electrically conductive wires.

24. The semiconductor package according to claim 22, wherein said connection means comprise electrically conductive balls.

25. The semiconductor package according to claim 22, wherein said connection means comprise a direct attachment of said leads of said plurality of leads to corresponding input/output pads of said semiconductor chip.

26. The semiconductor package according to claim 22, wherein said package comprises one of a plurality of said packages stacked on top of and electrically connected to one another.

27. A semiconductor package, comprising;
a semiconductor chip having an integrated circuit;
a plurality of input/output pads on a central portion of a first surface of said semiconductor chip for making electrical connections between the integrated circuit of said semiconductor chip and a circuit external thereto;
a plurality of leads from a lead frame, each said lead having an inner end portion extending radially inward toward said input/output pads on said chip and an upper and a lowersurface, one of which surfaces is bonded to said first surface of said semiconductor chip, and a projection having a raised surface formed on at least one of said upper and lower surfaces of each said lead at a distal end portion thereof;
electrically conductive wires connecting said leads of said plurality of leads to corresponding input/output pads of said semiconductor chip;
an encapsulated portion enveloping said semiconductor chip, said plurality of leads, and said electrically conductive wires such that said raised surfaces of said projections are flush with an outer surface of said encapsulated portion; and,
a plurality of solder balls respectively welded to said raised surface of said projection of each said lead on at least one of said upper and lower surfaces thereof.

28. The semiconductor package according to claim 27, wherein a second surface of said semiconductor chip opposite to said first surface thereof is exposed to the atmosphere exteriorly of said encapsulated portion for dissipation of heat therefrom.

29. The semiconductor package according to claim 27, wherein said package comprises one of a plurality of said packages stacked on top of and electrically connected to one another.

30. A semiconductor package, comprising:
a semiconductor chip having an integrated circuit;
a plurality of input/output pads on a first surface of said semiconductor chip for making electrical connections between the integrated circuit of said semiconductor chip and a circuit external thereto;
a chip heat sink having a surface bonded to a surface of said semiconductor chip;
a plurality of leads from a lead frame, each said lead having an inner end portion extending radially inward toward said input/output pads on said chip and an upper and a lower surface, one of which surfaces is bonded to a surface of said semiconductor chip, and a projection having a raised surface integrally formed on at least one of said upper and lower surfaces of each said lead at a distal end portion thereof;
connection means for electrically connecting said leads of said plurality of leads to corresponding input/output pads of said semiconductor chip;
an encapsulated portion enveloping said semiconductor chip, said plurality of leads and said connection means such that said raised surfaces of said projections are flush with an outer surface of said encapsulated portion, and a second surface of said semiconductor chip opposite to said first surface thereof is exposed to the atmosphere exteriorly of said encapsulated portion; and,
a plurality of solder balls respectively welded to said raised surface of said projection of each said lead on at least one of said upper and lower surfaces thereof.

31. The semiconductor package according to claim 30, wherein said chip heat sink has a surface exposed to the atmosphere exteriorly of said encapsulated portion.

32. The semiconductor package according to claim 30, wherein said package comprises one of a plurality of said packages stacked on top of and electrically connected to one another.

33. A semiconductor package, comprising:
a semiconductor chip having an integrated circuit;
a plurality of input/output pads on a first surface of said semiconductor chip for making electrical connecting between the integrated circuit of said semiconductor chip and a circuit external thereto;
a chip heat sink having a surface bonded to said first surface of said semiconductor chip;
a plurality of leads from a lead frame, each said lead having an inner end portion extending radially inward toward said input/output pads on said chip and an upper and a lower surface, one of which surfaces is bonded to a surface of said semiconductor chip, and a projection having a raised surface integrally formed on at least one of slid upper and lower surfaces of each said lead at a distal end portion thereof;
connection means for electrically connecting said leads of said plurality of leads to corresponding input/output pads of said semiconductor chip;
an encapsulated portion enveloping said semiconductor chip, said plurality of leads and said connection means such that said raised surfaces of said projections are flush with an outer surface of said encapsulated portion; and,
a plurality of solder balls respectively welded to said raised surface of said projection of each said lead on at least one of said upper and lower surfaces thereof.

34. The semiconductor package according to claim 33, wherein said chip heat: sink has a surface exposed to the atmosphere exteriorly of said encapsulated portion.

35. The semiconductor package according to claim 33, wherein said package comprises one of a plurality of said packages stacked on top of and electrically connected to one another.

* * * * *